United States Patent [19]

Hendrickson

[11] 4,266,237

[45] May 5, 1981

[54] SEMICONDUCTOR APPARATUS

[75] Inventor: Thomas E. Hendrickson, Wazata, Minn.

[73] Assignee: Honeywell Inc., Minneapolis, Minn.

[21] Appl. No.: 73,157

[22] Filed: Sep. 7, 1979

[51] Int. Cl.³ .................................. H01L 27/14
[52] U.S. Cl. .................................. 357/41; 357/30; 357/23; 357/24; 307/304; 307/311
[58] Field of Search .................. 357/41, 30, 23, 24; 307/304, 311

[56] References Cited

U.S. PATENT DOCUMENTS

| 3,877,057 | 4/1975 | Engeler | 357/24 |
| 3,890,500 | 6/1975 | Eichelberger | 250/211 J |
| 3,946,151 | 3/1976 | Kamiyama | 178/7.1 |
| 4,041,519 | 8/1977 | Melen | 357/30 |
| 4,115,692 | 9/1978 | Balcerak | 250/338 |
| 4,117,514 | 9/1978 | Terui | 358/213 |
| 4,148,048 | 4/1979 | Takemoto | 357/30 |
| 4,148,051 | 4/1979 | Koike | 357/30 |
| 4,169,273 | 9/1979 | Hendrikson | 358/213 |

Primary Examiner—Martin H. Edlow
Attorney, Agent, or Firm—Theodore F. Neils

[57] ABSTRACT

A photodetector signal processing arrangement is provided for converting small photodetector output signal currents to sufficiently high voltages to operate subsequent circuitry using the capacitance as the conversion needs.

14 Claims, 4 Drawing Figures

SEMICONDUCTOR APPARATUS

BACKGROUND OF THE INVENTION

Many photodetectors, such as the photodiode and the conductor-insulator-semiconductor (CIS), provide output signal currents in response to electromagnetic radiation impinging thereon, on the order of nanoamperes ($10^{-9}$ amperes). This order of photodetector currents assumes typical light intensities encountered in scene images and acceptably sized radiation sensitive areas, which, in a monolithic integrated circuit, are on the order of 10.0 mil$^2$. Generally, there is a desire for such photodetector output currents to be converted to a voltage for operating subsequent photodetector signal processing circuitry. To effect such a conversion, one possibility would be to have the photodetector output current directed through a resistance. However, to obtain a sufficient voltage to operate subsequent signal processing circuitry, either a very large resistance or very sensitive subsequent circuitry is required, or both, because of the very small photocurrents generated by the photodetector.

Neither of these requirements—a high resistance or very sensitive subsequent circuitry—is readily met in a monolithic integrated circuit chip fabricated by typical processes to yield metal-oxide-semiconductor field-effect transistor (MOSFET) devices in the integrated circuit chip. Large resistances take a substantial amount of area in the chip major surface which has a detrimental effect on the chip cost. Small signal amplifiers constructed from MOS field-effect transistors typically require signals in excess of 100 millivolts to be successfully operated on by such amplifiers. Thus, an alternative means for converting the small output signals provided by the typical and desired photodetector structures is desirable.

SUMMARY OF THE INVENTION

The invention provides a photodetector signal processing arrangement in which the output signal of a photodetector is used to discharge a charged capacitance through a semiconductor material channel determined by a threshold means. The capacitance is charged by switching means adapted for connection to a power supply means. The signal processing arrangement output signal is obtained from a transfer means having an input electrically in common with one side of the capacitance being discharged.

The photodetector signal processing arrangement is easily implemented in a monolithic integrated circuit using metal-oxide-semiconductor (MOS) device structures. These structures will typically be metal-oxide-semiconductor field-effect transistors.

DESCRIPTION OF THE PREFERRED EMBODIMENT

Figure 1:
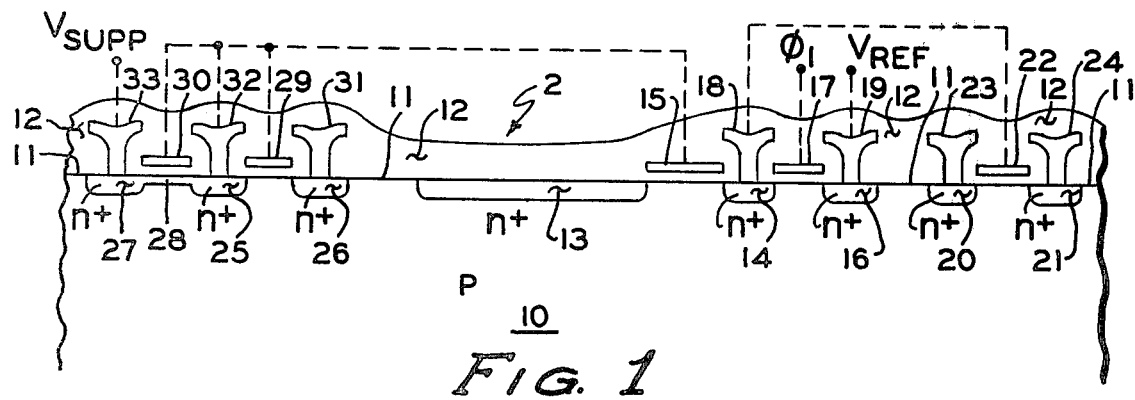
FIG. 1 shows a cross section of a portion of a monolithic integrated circuit containing structural elements of the present invention.

FIG. 1 shows a semiconductor material substrate, 10, which is usually silicon doped with boron to have a p-type conductivity. Typically, the resistivity of substrate 10 will be between 4 and 12 ohm-cm. The silicon is typically Czchrolski grown and has a major surface, 11, which is a (100) plane through and on which any fabrication process, resulting in circuit components associated with the substrate, will take place.

Provided on surface 11 is an insulating material layer, 12, which is between silicon substrate 10 and certain gate structures, as well as more or less surrounding certain of these gate structures, and substantially around several terminal structures. Typically, insulating material 12 will be silicon dioxide although some other material could be used such as silicon nitride. Insulating material layer 12 will usually be provided as a multiplicity of layers with the portion on major surface 11 often being grown while subsequent portions are usually deposited.

In FIG. 1, a photodetector is presented in the form of a photodiode formed by a n+-type conductivity region, 13, located in silicon substrate 10. This region might be formed by either a diffusion step or an ion implantation step concurrently with the formation of the other n+-type conductivity regions shown located in substrate 10 in FIG. 1. The dopant used to form these regions will be typically phosphorus provided in a concentration of $10^{19}$ atoms/cm$^3$. The thickness of the insulating layer 12 over region 13 will be on the order of 5000 Å which is thin enough to permit the electromagnetic radiation of interest to pass through insulating layer 12 with relatively negligible attenuation before impinging on region 13.

To the right of region 13 in FIG. 1 is formed a storage region, 14, spaced apart from region 13 in surface 11 and substrate 10. Region 14, in being formed concurrently with region 13, has a conductivity type and conductivity similar to that occurring in region 13 as do the other n+-type conductivity regions shown formed in substrate 10 in FIG. 1. A gate structure, 15, is shown across a portion of insulating material 12 from the space in surface 11 between regions 13 and 14. Gate structure 15 will typically be of doped polycrystalline silicon, or of a metal, provided by a deposition step on a portion of insulating material layer 12. The thickness of the portion of insulating material 12 between gate structure 15 and surface 11 will typically be 1000 Å. The other gate structures also shown in FIG. 1, and separated from surface 11 by a portion of insulating material 12 will typically be formed at the same time as gate structure 15, and, as a result, will be of the same material and separated from major surface 11 by approximately the same thickness of material 12.

To the right of storage region 14 is formed a switch reference region, 16, again having a similar conductivity type and conductivity as does photodiode region 13. Region 16 is spaced apart from region 14 in surface 11 and substrate 10, and a gate structure, 17, is formed across a portion of insulating material 12 from that space in surface 11 separating switch storage region 16 from storage region 14. Also, an interconnection means, 18, is in ohmic contact with storage region 14 and an interconnection means, 19, is in ohmic contact with switch reference region 16.

The foregoing structures just described can be seen to form a series-connected pair of metal-oxide-semiconductor field-effect transistor (MOSFET) devices of the n-channel, enhancement mode kind. That is, with a positive voltage assumed applied to switch reference region 16, the above structure can be described as a first MOSFET formed by reference region 16 serving as the drain and by storage region 14 serving as the source, with gate structure 17 serving as the transistor gate. Further, storage region 14 serves not only as a source for the first MOSFET, but also serves as an electrically common drain for the second MOSFET for the comprising photodiode region 13 as the source and gate structure 15 as the transistor gate. Thus, this series-connected MOSFET pair is further connected in series with the photodiode formed by region 13 and substrate 10 such that the photodiode cathode is electrically in common with the source region of the second MOSFET having gate 15.

Figure 3:
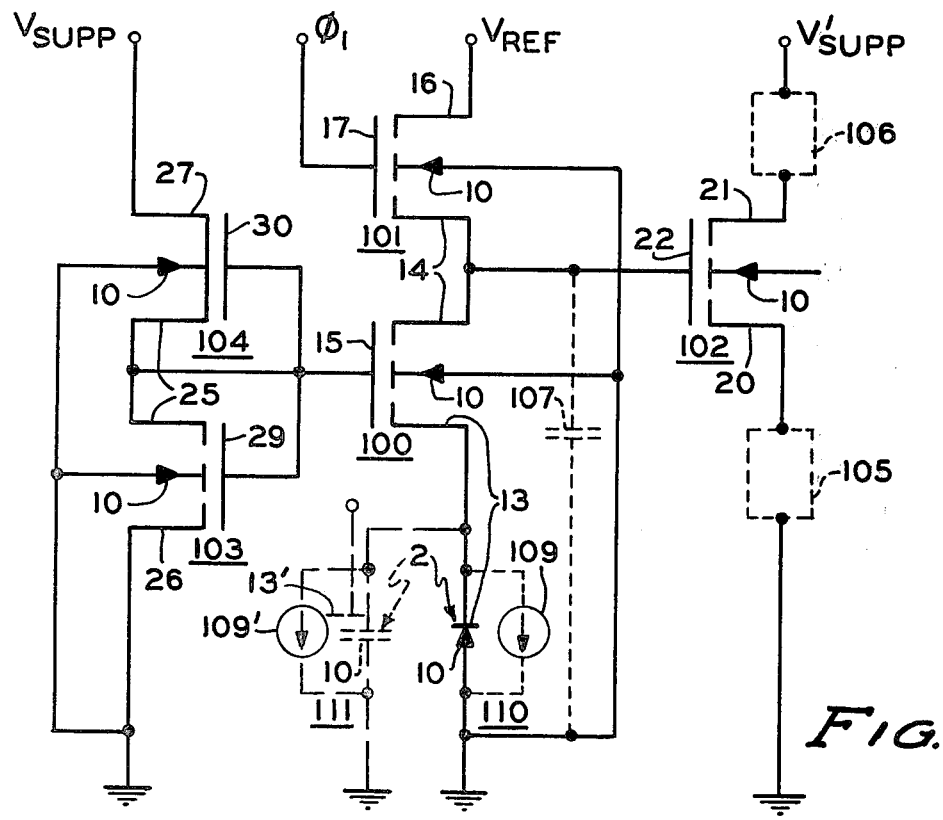
FIG. 3 shows a circuit schematic diagram of the present invention.

This arrangement can be seen in the circuit schematic of FIG. 3 by noting some of the similar numerical designations occurring there as are used in designating the associated structures in FIG. 1. In FIG. 3, the MOSFET having gate structure 15 in FIG. 1 has been designated 100, while the MOSFET having gate structure 17 in FIG. 1 has been designated 101. The photodiode having region 13 has been designated 110, and contains a photocurrent generator, 109, which generates currents in response to electromagnetic radiation impinging on photodiode 110.

Further to the right in FIG. 1, is shown another structure, this structure being that of an ordinary MOSFET. This device has a source region, 20, and a drain region, 21, both being of an n+-type conductivity as a result of being formed concurrently with region 13. The device also has a gate region, 22. An interconnection means, 23, is in ohmic contact with source region 20 and another interconnection means, 24, is in ohmic contact with drain region 21. This MOSFET is designated in FIG. 3 by 102 and, again, has the same numerical designations in FIG. 3 as occur in FIG. 1 for some of the associated structural portions shown there.

A further structure shown in FIG. 1, in this instance to the left of photodiode region 13, is a structure comprising a series-connected pair of MOSFET devices. This pair is both n-channel devices, but one is an enhancement mode device while the other is a depletion mode device. A joint service region, in substrate 10, 25, serves as the source region for the depletion mode device, and as the drain region for the enhancement mode device. A further region, 26, in substrate 10 serves as the source region for the enhancement mode device. Again, another region 27, in substrate 10 serves as the drain region for the depletion mode device. Finally, a channel region, 28, serves to bridge regions 25 and 27 to render what would otherwise be an enhancement mode device a depletion mode device.

The enhancement mode device has a gate structure, 29, while the depletion mode device has a gate structure, 30. Also, there is an interconnection means, 31, in ohmic connection with the enhancement mode source region 26. Another interconnection means, 32, is in ohmic connection with the joint service region 25. A further interconnection means, 33, is in ohmic contact with the depletion mode drain region 27.

These devices of FIG. 1 are also shown in FIG. 3. In FIG. 3, the enhancement mode device is designated 103 while the depletion mode device is designated 104.

Certain of the designations in FIG. 3 are the same as are used for the associated structural features of these MOSFET devices in FIG. 1.

In operation, substrate 10 is electrically connected to some voltage reference, e.g., ground. Switch reference region 16 is connected through interconnection means 19 to a substantially constant, positive voltage, $V_{REF}$, which might typically be five or six volts. Gate structure 17 is connected to a periodic, pulsed voltage source designated $\phi_1$. A constant polarity, positive voltage, $V_{SUPP}$ is supplied to depletion mode transistor drain region 27 through interconnection means 33. These voltages are shown in FIG. 1 supplied to these regions via dashed line interconnection representations which represent portions of the various interconnection means not otherwise shown in structural form. Further dashed line interconnections are shown in FIG. 1 to provide direct connections between gate structure 15, gate structure 29, gate structure 30 and joint service region 25. A further interconnection is shown by dashed line between storage region 14 and gate structure 22. These dashed line interconnection representations again represent portions of interconnection means not shown in structural form.

These various interconnections are also shown in FIG. 3 as circuit electrical interconnections. Further, the above-mentioned voltages are shown at the terminals in the circuit to which they are supplied.

Finally, there is further shown in FIG. 3 in short dashed line form, a pair of load means, 105 and 106, either or both of which may be connected to the output MOSFET 102. Load means 105 is shown connected to source 22 of MOSFET 102 while load means 106 is shown connected to drain 21 of this transistor. A further constant polarity, positive voltage, $V'_{SUPP}$ provided to load means 106 if it is present in the circuit. If load 106 is not present, $V'_{SUPP}$ is supplied directly to drain 21 of transistor 102. Similarly, if load means 105 is not present in the circuit, a direct connection is made between source 22 and ground. Conceivably, voltages $V_{SUPP}$, $V_{REF}$ $V'_{SUPP}$ could be supplied from the same voltage source, although different sources could be used for each of these voltages if desirable in a particular circuit application. Voltage $\phi_1$ will typically be supplied from a clock circuit providing a square wave pulse of a selected duty cycle sufficient for operating the circuit of FIG. 3. The waveform for voltage $\phi_1$ is shown in the first graph of FIG. 4.

Figure 4:
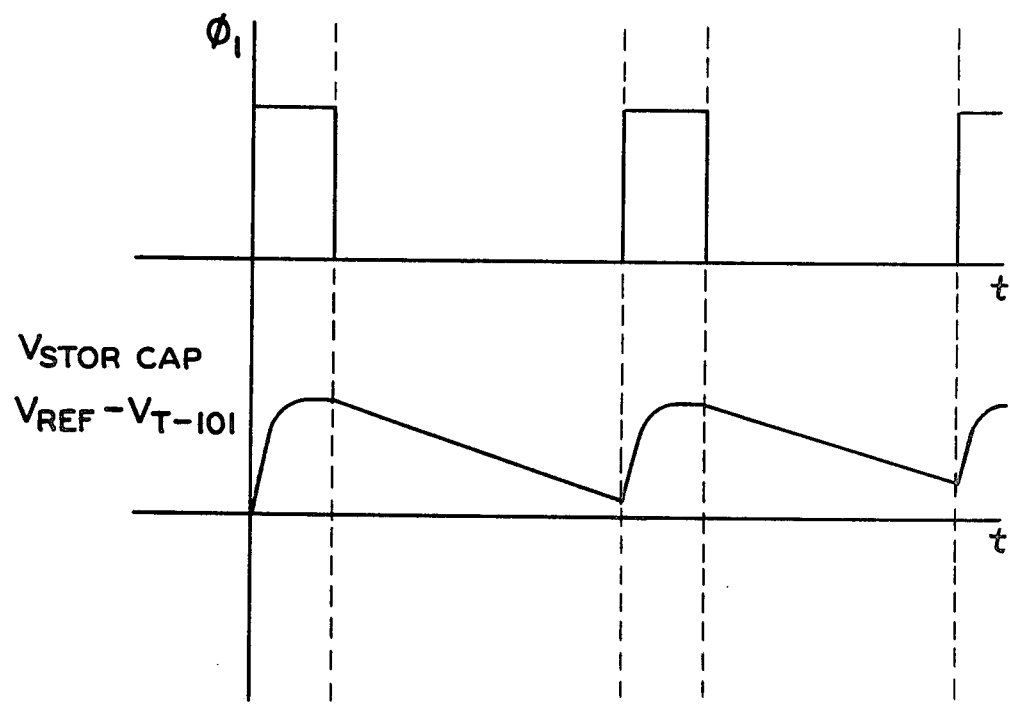
FIG. 4 shows graphs of signals occuring during operation of the present invention.

At time zero, the first graph in FIG. 4 shows a positive pulse portion occurring in a cycle of periodic voltage $\phi_1$ which is of a value sufficient to switch on transistor 101 in FIG. 3. This will permit the voltage source supplying voltage $V_{REF}$ to charge a capacitance, 107, through transistor 101. Capacitance 107 is shown in short dashed line form in FIG. 3 and represents a parasitic capacitance inherent in the structures of FIG. 1 leading to the device component representations shown in FIG. 3. That is, capacitance 107 in FIG. 3 represents the capacitance occurring between storage region 14 and substrate 10 and the further capacitance occurring between gate region 22 and substrate 10. Device theory predicts these parasitic capacitances will approximately total 0.07 to 0.1 picofarads for regions 14 and 22 being of a relatively small size. As will be seen later, for purposes of providing the maximum voltage output signal for a given photodetector current, the capacitance value of capacitance 107 should be as small as practical.

Capacitance 107 will charge through transistor 101 to a voltage approximately equal to $V_{REF} - V_{T\text{-}101}$, that is, to a voltage equal to $V_{REF}$ less the threshold voltage of transistor 101. This voltage will, of course, appear on gate 22 of transistor 102. The second graph in FIG. 4 shows the voltage occurring across capacitance 107, $V_{STOR\ CAP}$.

Enhancement mode transistor 103 and depletion mode transistor 104 together form a voltage reference means for providing a reference voltage to gate 15 of transistor 100. The voltage applied to gate 15 is equal to the threshold voltage of transistor 103 plus a selected additional voltage determined by the length and width of the channel depletion transistor 104, serving as the load means for transistor 103, relative to the length and width of the channel of transistor 103. Typically, the additional voltage beyond the threshold of transistor 103 is a few tens of millivolts.

This reference voltage applied to gate 15 of transistor 100 keeps transistor 100 switched on continually. Thus, any currents generated in photodiode 110 by generator 109 and any leakage current through photodiode 110 can be provided through transistor 101 when voltage $\phi_1$ is in the positive voltage portion of its cycle.

At the termination of the positive voltage portion of a cycle in the $\phi_1$ voltage wave, transistor 101 will switch off while transistor 100 will continue to be switched on because of the reference voltage applied to gate 15 thereof. Thus, any photocurrents occurring in photodiode 110 plus any leakage current occurring therethrough will serve to discharge capacitance 107 through transistor 100. The amount of discharge of capacitance 107 in a given time will be related to the amount of photocurrent generated during this time which in turn is directly related to the amount of light impinging on photodiode 110. The impinging of electromagnetic radiation in the depletion region about the semiconductor pn junction around region 13 generates charge pairs with the electrons becoming available as the photocurrent basis in region 13. The pn junction is quite shallow so these electrons are available near surface 11 in region 13 serving as a source for transistor 100.

The time available for photodetector output current to discharge capacitance 107 is the zero voltage portion of a cycle in the $\phi_1$ voltage waveform occurring after the positive voltage portion in a cycle and before the beginning of the subsequent cycle as shown in FIG. 4. This time can be considered the integration time of the photodetector output current on capacitance 107.

Since capacitance 107 was charged to voltage $V_{REF} - V_{T\text{-}101}$ in voltage at the end of the integration time in a cycle will be the following:

$$V_{STOR\ CAP} = V_{REF} - V_{T\text{-}101} - (I_{PHOTO}t/C)$$

where t occurs in a $\phi_1$ cycle integration portion. As stated above, capacitance 107 might have a typical value of 0.07 picofarads. If the area of region 13 where it intersects major surface 11 in FIG. 1 is 10.0 mil$^2$, the photodetector output current will be on the order of 1.0 nanoamps for typical image scene conditions. A typical integration period in the voltage $\phi_1$ cycle would be 20 microseconds. As a result, the circuit of FIGS. 1 and 3 can provide an output voltage swing for this level of photodetector current of approximately 300 millivolts across capacitance 107. As the above equation shows, the smaller the capacitance value of capacitance 107 and the longer the integration time, the larger will be the output voltage swing. This same voltage swing is supplied to gate 22 of transistor 102 to impress this signal swing on either load means 105 or load means 106, or both. The high electrical impedance presented by gate region 22 to the preceding circuitry precludes any loading of capacitance 107 by the output transfer device, transistor 102.

At the end of the integration time in a cycle of the Ⓡ$_1$ voltage waveform, a new cycle begins with another positive voltage pulse as shown in FIG. 4. Thus, the circuit of Figure 3 provides a sampling of that portion of the scene image impinging on photodiode 110 therein, i.e., of the scene image portion impinging on the portion of major surface 11 intersected by photodiode region 13 in FIG. 1. The sampling rate is determined by the cycle frequency in voltage waveform $\phi_1$. This frequency is determined by several considerations. These are primarily (i) sensitivity: that there be sufficient integration time in each $\phi_1$ waveform cycle to provide a significant discharge under the lowest light sensing level anticipated so that a significant voltage swing can develop across capacitance 107; (ii) system response time: that the sampling rate, i.e., the cycle frequency in the $\phi_1$ voltage waveform be sufficiently high to detect the maximum rates of change expected in the light levels occurring in the image scene impinging on the photodiode due to the maximum rate of events occurring in the image scene; and (iii) photodiode leakage; that the integration time in a $\phi_1$ waveform cycle be sufficiently short so that the photodiode leakage does not constitute too great a fraction of whatever capacitor discharge occurs in that cycle integration time. Of course, these considerations assume that capacitance 107 can be charged very quickly relative to any reasonable integration time so that the positive voltage portion of a $\phi_1$ waveform cycle will be a relatively insignificant fraction of the total period.

In situations in which the scene image light level is sufficiently high, and the integration portion of the $\phi_1$ period is sufficiently long, the voltage of capacitor 107 can be reduced by discharge to a level near the voltage occurring across photodiode 110. The voltage across photodiode 110 will be approximately the additional voltage appearing at the gate of transistor 100 in excess of the threshold voltage of transistor 103 since the threshold voltage of transistors 100 and 103 are likely to be quite similar by virtue of having been fabricated simultaneously by the same process. In those situations where the voltage across capacitance 107 begins to drop to such low values, the voltage swing will no longer be very directly related to the light conditions occurring on the surface of the photodiode 110 because of the behavior of transistor 100 under such conditions.

However, any such light bursts which cause the conditions in one cycle of $\phi_1$ to become such that capacitance 107 is nearly completely discharged will not affect the subsequent cycle should such a bright light have ceased at that point. That is, the photodetector processing circuitry is not subject to degradations of subsequent cycles because of being saturated or overdriven in previous cycles. This is because at the beginning of each new $\phi_1$ waveform cycle, capacitance 107 is again charged to $V_{REF} - V_{T\text{-}101}$ to re-establish the same initial conditions in each cycle.

Since photodiode 110 is separated from the circuit node to which capacitance 107 and transistors 100, 101 and 102 are commonly connected, the circuit parasitics connected with photodiode 110, i.e., with photodiode region 13 in FIG. 1, do not affect the output of the photodetector signal processing circuit. In particular, the capacitance changes which would occur in changing that area of photodiode region 13 in FIG. 10 intersecting surface 11 will not be reflected in the operation of the circuit at the circuit node just referred to. Thus, the sensitivity of the circuit can be affected not only by the choice of the time of the integration portion in a voltage $\phi_1$ period, but also by the choice of the surface area of photodiode region 13 in surface 11 of FIG. 1 which determines the photocurrents generated for a given impinging radiation level. Thus, there are two independent parameters which can be adjusted to attain whatever sensitivity is desired for the photodetector-photodetector signal processing circuit arrangement shown in FIGS. 1 and 3.

Figure 2:
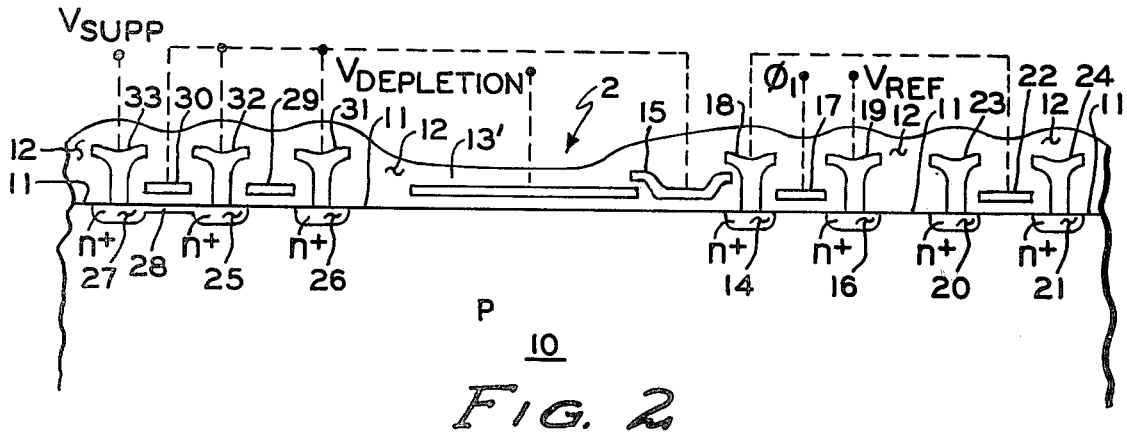
FIG. 2 shows a cross section of an alternative embodiment of a structural element in the monolitic integrated circuit of FIG. 1.

Another version of the photodetector output signal processing arrangement of the present invention is shown in FIG. 2 where a different kind of photodetector has been substituted for the photodiode present in FIG. 1 by virtue of photodiode region 13. In FIG. 2, a conductor-insulator-semiconductor (CIS) detector is used which is essentially an MOS capacitor having a transparent capacitor plate, 13'. A constant polarity positive voltage, $V_{DEPLETION}$, is supplied to plate 13' by virtue of the dashed line connection shown in FIG. 2. This voltage induces a depletion region in the semiconductor material of substrate 10 below plate 13' such that photocurrents can be generated in this depletion region by impinging electromagnetic radiation. These photocurrents can be taken from near surface 11 of substrate 10 to discharge the capacitance associated with storage region 14 and gate region 22 through the effective MOSFET formed by having storage region 14 serve as a drain, gate structure 15 serve as a gate, and the depletion region under plate 13' serve as the source.

In operation, as just stated, impressing voltage $V_{DEPLETION}$ on plate 13' results in a depletion region being induced in substrate 10. This is followed by impinging radiation providing charge pairs within this resulting depletion region, the positive charges being transported to substrate 10 and the negative charges accumulating in the depletion region at surface 11 under plate 13' in response to $V_{DEPLETION}$ occurring thereon. These negative charges will accumulate until there is a voltage between the neutral portion of substrate 10 and the surface portion of the depletion region, as it intersects major surface 11, equal to approximately that portion of the voltage at the gate of transistor 100, i.e., gate structure 15, which exceeds the threshold voltage of transistor 103. This is again true because the threshold voltages of transistors 100 and 103 are going to be approximately the same since they are simultaneously fabricated by the same process. The remaining voltage between plate 13' and substrate 10 will be dropped across insulating material layer 12.

Once this charging of the depletion region under plate 13' has occurred, further charge generation by impinging electromagnetic radiation passing through plate 13 and insulating material 12 to substrate 10 will provide electrons near surface 11 at region 13 as the basis for a photodetector current just as occurs in the structure of FIG. 1 in photodiode region 13. Thus, the surface region of the depletion region under plate 13' becomes sort of a third terminal region in the CIS photodetector and can serve as the source for transistor 100 of FIG. 3. In all other aspects, the operation of the structure shown in FIGS. 1 and 2 is the same.

FIG. 3 has circuitry shown by long dashed lines added to it to represent, in the alternative, the photodetector structure shown in FIG. 2. This representation in FIG. 3 has been designated 111 and shows a sort of three terminal capacitive representation for the CIS photodetector of FIG. 2. Again, a current generator, 109', represents the photodetector currents generated by impinging electromagnetic radiation.

Note, that again plate 13' can be varied in area to change the sensitivity of the photodetector-photodetector output signal processing circuit. This change in area of plate 13' can be done without changing the capacitive loading appearing at the circuit node to which capacitance 107 and transistors 100, 101 and 102 are commonly connected.

The embodiments of the invention in which an exclusive property or right is claimed are define as follows:

1. A semiconductor photodetector signal processing device for providing an output signal indicative of that amount of electromagnetic radiation impinging on a photodetector during a previous time duration, said photodetector signal processing device comprising:

a semiconductor material body of a first conductivity type, in at least some parts of a first portion thereof serving as a substrate, and having a major surface such that said first body portion intersects said major surface in a first major surface portion;

said photodetector provided in a first location at said first major surface portion, said photodetector being capable of providing charge carriers near said first major surface portion at said first location in response to electromagnetic radiation impinging thereon;

a storage region of a second conductivity type provided in said first body portion and intersecting said first major surface portion at a second location therein spaced apart from said photodetector at said first location, there being a storage region pn junction separating said storage region and remaining parts of said body portion;

a reference gate conductive means separated from said first major surface portion by a first insulating layer and located across said first insulating layer from that space occurring between said photodetector and said storage region in said first major surface portion;

a reference means having an output region, said reference means being capable of providing a selected voltage potential at said output region when said reference means is electrically energized, said reference means output region being electrically in common with said reference gate conductive means, said reference means being also electrically connected to a first interconnection means adapted for electrical connection to a first power supply means;

a switching means having first and second terminating regions and having a control region therein by which said switching means is capable of being directed to effectively provide a conductive path of a selected conductivity between said switching means first and second terminating regions, said switching means first terminating region being electrically connected to a second interconnection means adapted for electrical connection to a second power supply means, said switching means second terminating region being electrically in common with said storage region, and said switching means control region being electrically connected to a third interconnection means adapted for electrical connection to a third power supply means providing a periodic output; and a transfer transistor device having an input region, said transfer means input region being electrically in common with said storage region and being at least part of an arrangement presenting a large electrical impedance thereto.

2. The device of claim 1 wherein said transfer transistor device is a field-effect transistor with said transfer means input region being a gate region for said field-effect transistor.

3. The device of claim 1 wherein said photodetector is a photodiode having a photodiode region of a second conductivity type provided in said first body portion and intersecting said first major surface portion at said first location, there being a photodiode region pn junction separating said photodiode region and remaining parts of said first body portion.

4. The device of claim 1 wherein said photodetector is a conductor-insulator-semiconductor detector having a photodetector gate conductive means separated from said first major surface portion by a second insulating layer at said first location, said photodetector gate conductive means being substantially transparent to said electromagnetic radiation, said photodetector gate conductive means being electrically connected to a fourth interconnection means adapted for electrical connection to a fourth power supply means.

5. The device of claim 1 wherein said switching means comprises:

a switch reference region of a second conductivity type provided in said first body portion and intersecting said first major surface portion at a third location therein spaced apart from said storage region at said second location, there being a switch reference region pn junction separating said switch reference region and remaining parts of said first body portion, said switch reference region serving as said switching means first terminating region; and a switch reference gate conductive means separated from said first major surface portion by a third insulating layer and located across said third insulating layer from that spacing occurring between said storage region and said switch reference region in said first major surface portion, said switch reference gate conductive means serving as said switching means control region.

6. The device of claim 2 wherein said field-effect transistor is an enhancement mode MOS field-effect transistor.

7. The device of claim 2 wherein said photodetector is a photodiode having a photodiode region of a second conductivity type provided in said first body portion and intersecting said first major surface portion at said first location, there being a photodiode region pn junction separating said photodiode region and remaining parts of said first body portion.

8. The device of claim 2 wherein said photodetector is a conductor-insulator-semiconductor detector having a photodetector gate conductive means separated from said first major surface portion by a second insulating layer at said first location, said photodetector gate conductive means being substantially transparent to said electromagnetic radiation, said photodetector gate conductive means being electrically connected to a fourth interconnection means adapted for electrical connection to a fourth power supply means.

9. The device of claim 2 wherein said switching means comprises:

a switch reference region of a second conductivity type provided in said first body portion and intersecting said first major surface portion at a third location therein spaced apart from said storage region at said second location, there being a switch reference region pn junction separating said switch reference region and remaining parts of said first body portion, said switch reference region serving as said switching means first terminating region; and a switch reference gate conductive means separated from said first major surface portion by a third insulating layer and located across said third insulating layer from that space occurring between said storage region and said switch reference region in said first major surface portion, said switch reference gate conductive means serving as said switching means control region.

10. The device of claim 2 wherein said reference means comprises:

a first enhancement mode MOS field-effect transistor having a source region, a drain region and a gate region; and a first depletion mode MOS field-effect transistor having a source region, a drain region and a gate region, said first depletion mode transistor source region being electrically in common with said first enhancement mode transistor drain region and being electrically in common with said reference means output region, said first enhancement mode transistor gate region and said first depletion mode transistor gate region also being electrically connected to said reference means output region.

11. A photodetector signal processing circuit for providing an output signal indicative of that amount of electromagnetic radiation impinging on a photodetector during a previous time duration, said photodetector signal processing circuit comprising:

said photodetector having first and second terminal regions;

a first enhancement mode MOS field-effect transistor having a source, a drain and a gate, said first enhancement mode transistor source being electrically in common with said photodetector first terminal region;

a second enhancement mode MOS field-effect transistor having a source, a drain and a gate, said second enhancement mode transistor source being electrically in common with said first enhancement mode transistor drain, said second enhancement mode transistor drain being electrically connected to a first interconnection means adapted for connection to a first power supply means, and said second enhancement mode transistor gate being electrically connected to a second interconnection means adapted for electrical connection to a second power supply means providing a periodic output;

a reference means having an output, said reference means being capable of providing a selected voltage potential at said output when electrically energized, said reference means output being electrically in common with said first enhancement mode transistor gate, said reference means also being electrically connected to a third interconnection means adapted for electrical connection to a third power supply means; and a third enhancement mode MOS field-effect transistor having a source, a drain and a gate, said third enhancement mode transistor gate being directly electrically connected to said first enhancement mode transistor drain, with at least a selected one of said third enhancement mode transistor source and drain being adapted for electrical connection to a load means.

12. The circuit of claim 11 wherein said photodetector is a photodiode.

13. The circuit of claim 11 wherein said photodetector is a conductor-insulator-semiconductor photodetector.

14. The device of claim 11 wherein said reference means comprises:

a fourth enhancement mode MOS field-effect transistor having a source, a drain and a gate; and a first depletion mode MOS field-effect transistor having a source, a drain and a gate, said first depletion mode transistor source being electrically in common with said first enhancement mode transistor drain and being electrically in common with said reference means output, said first enhancement mode transistor gate and said first depletion mode transistor gate also being electrically connected to said reference means output.

* * * * *